(12) United States Patent
Sharma et al.

(10) Patent No.: US 11,142,825 B2
(45) Date of Patent: Oct. 12, 2021

(54) COATING OF NANO-SCALED CAVITIES

(71) Applicant: AVERATEK CORPORATION, Santa Clara, CA (US)

(72) Inventors: Sunity K. Sharma, Fremont, CA (US); Shinichi Iketani, Sunnyvale, CA (US)

(73) Assignee: AVERATEK CORPORATION, Santa Clara, CA (US)

( * ) Notice: Subject to any disclaimer, the term of this patent is extended or adjusted under 35 U.S.C. 154(b) by 0 days.

(21) Appl. No.: 16/780,715

(22) Filed: Feb. 3, 2020

(65) Prior Publication Data

US 2020/0248311 A1    Aug. 6, 2020

Related U.S. Application Data

(60) Provisional application No. 62/800,257, filed on Feb. 1, 2019.

(51) Int. Cl.
*H05K 3/42* (2006.01)
*C23C 18/31* (2006.01)
*C23C 18/16* (2006.01)
*C23C 14/04* (2006.01)
*H05K 3/00* (2006.01)
*C23C 16/04* (2006.01)

(52) U.S. Cl.
CPC .......... *C23C 18/31* (2013.01); *C23C 18/1637* (2013.01); *C23C 18/1641* (2013.01); *C23C 18/1642* (2013.01); *C23C 14/046* (2013.01); *C23C 16/045* (2013.01); *H05K 3/0094* (2013.01); *H05K 3/42* (2013.01)

(58) Field of Classification Search
USPC ........................................................ 427/97.7
See application file for complete search history.

(56) References Cited

U.S. PATENT DOCUMENTS

| 6,211,073 B1 | 4/2001 | Ahn et al. |
| 8,900,645 B2 | 12/2014 | Tominaga et al. |
| 2010/0167540 A1* | 7/2010 | Sakuma ............... H01J 37/321 438/676 |

(Continued)

OTHER PUBLICATIONS

L. Woods and P. Meyers, Atmospheric Pressure Chemical Vapor Deposition and Jet Vapor Deposition of CdTe for High Efficiency Thin Film PV Devices; Final Technical Report, Jan. 26, 2000-Aug. 15, 2002; National Renewable Energy Laboratory (44 pages) dated Aug. 2002.

(Continued)

*Primary Examiner* — Brian K Talbot
(74) *Attorney, Agent, or Firm* — Fish IP Law., LLP

(57) ABSTRACT

Methods, systems, and apparatus for coating the internal surface of nano-scale cavities on a substrate are contemplated. A first fluid of high wettability is applied to the nano-scale cavity, filling the cavity. A second fluid carrying a conductor or a catalyst is applied over the opening of the nano-scale cavity. The second fluid has a lower vapor pressure than the first fluid. The first fluid is converted to a gas, for example by heating the substrate. The gas exits the nano-scale cavity, creating a negative pressure or vacuum in the nano-scale cavity. The negative pressure draws the second fluid into the nano-scale cavity. The conductor is deposited on the interior surface of the nano-scale cavity, preferably less than 10 nm thick.

18 Claims, 4 Drawing Sheets

(56) References Cited

U.S. PATENT DOCUMENTS

2010/0320081 A1* 12/2010 Mayer ............... C25D 5/003
　　　　　　　　　　　　　　　　　　　　　　　　204/242
2019/0228975 A1* 7/2019 Markut ............... C25D 5/34

OTHER PUBLICATIONS

Bessueille, F. et al, (2009) 'Selective Metal Pattern Fabrication Through Micro-Contact or Ink-Jet Printing and Electroless Plating onto Polymer Surfaces Chemically Modified by Plasma Treatments', The Journal of Adhesion, 85: 10, 690-710.

* cited by examiner

COATING OF NANO-SCALED CAVITIES

This application claims the benefit of U.S. Provisional Patent No. 62/800,257, filed Feb. 1, 2019, which is incorporated by reference in its entirety herein.

FIELD OF THE INVENTION

The field of the invention relates to methods and systems for coating a nano scale cavity.

BACKGROUND

The following description includes information that may be useful in understanding the present invention. It is not an admission that any of the information provided herein is prior art or relevant to the presently claimed invention, or that any publication specifically or implicitly referenced is prior art.

Electrical devices tend to be more compact, and need to be capable of handling many tasks. Consequently, integrated circuits, especially in computers and smartphones, need to be small and complicated to achieve compactness of the devices with handling of many tasks.

In an integrated circuit, there are many electrical pathways presented and these electrical pathways are layered. Vias or trenches connect circuits on layers and various adjacent layers in an integrated circuit. For example, a via can connect circuits on adjacent layers or distal layers separated by one or more layers in the circuit. As vias and trenches provide conductive connections between layers, the vias and trenches are typically plated with a metal or other appropriate conductor. As integrated circuits are reduced in size to increase capacity, dimensions (e.g., diameter) of the vias and trenches are also reduced, further increasing the difficulty of plating metal in the vias or trenches. For example, as the diameter of surface openings of vias or trenches continue to shrink, metal carrying fluids are prevented from accessing the interior of the via or trench as the surface tension of the fluid is too high. This is problematic as electroless metal plating is preferred as it allows electroless metal to be deposited evenly along edges, inside of holes, and over irregular shaped objects.

U.S. Pat. No. 6,211,073 teaches a coating of a trench using diffusion barriers inside the trench. A diffusion barrier is used and presented inside of the cavity with the thickness of the diffusion barrier between 50 and 100 nanometer. Therefore, this method only works when the thickness of the cavity is greater than 50 nm. In addition, specific expensive machines are required to perform sputtering and jet-vaporing.

All publications identified herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Thus, there is still a need for coating inside surface of a cavities, especially of a nano-scaled cavities.

SUMMARY OF THE INVENTION

The inventive subject matter provides apparatus, systems, and methods in which a surface inside of a cavity, especially a nano-scaled cavity, is metal plated by the use of a high wettability liquid, for example a cryogenic solution or organic solvent. The wettability depends on the surface tension of the liquid. When surface tension of a liquid is too high, the liquid forms a sphere or droplet over the nano-scale opening to the cavity, such that the interior surface of the cavity is not wetted by the liquid. Such liquids are considered low wettability liquids. High wettability liquid is opposite to the low wettability liquid, such that high wettability liquids have lower surface tension, and the liquid is able to enter the nano-scale opening and wet the cavity.

Contemplated methods begin with a step of forming at least one cavity in a layer of a substrate. The shape of the cavity is varied and includes at least one of a cavity, a hole, a trench, a via, or an etching. The substrate is typically dielectric, but can include at least one of a polyimide, a cloth, a plastic, a metal, a ceramic, or a resin. In preferred embodiments, the cavity can be very small, nano-scaled, with the perimeter of an opening to the cavity of less than 3.5 µm, and a depth of the cavity less than 500 nm. However, methods are contemplated where the substrate is provided with a cavity (or cavities) already formed in the substrate.

Methods further include filling the cavity with a high wettability liquid, for example cryogenic solutions or organic solvents. Appropriate cryogenic solutions include liquid argon, liquid helium, liquid hydrogen, liquid nitrogen, and liquid oxygen. As described above, the high wettability liquid has a lower surface tension than low wettability liquids. For example, the surface tension of water at room temperature is 72 mN/m, while on the other hand, cryogenic solutions have lower surface tension, for example <15 mN/m. It should be appreciated that for a cavity with a nano-scale opening, water cannot enter the cavity due to the high surface tension. However, liquid with a low surface tension (e.g., cryogenic solution) can enter and fill the cavity.

A step of covering a surface of the substrate with a carrier liquid (e.g., metal carrying ink) is further contemplated, thereby covering the cavity filled with high wettability liquid with the carrier liquid. In some embodiments, the carrier liquid is an ink (preferably water based) including at least one of nickel, copper, platinum, gold, palladium, aluminum, titanium, magnesium, or combinations thereof. The ink (e.g., water based) has low vaporization pressure compared with high wettability liquids (e.g., water~25 Torr/cryogenic solutions>1000 Torr). The difference of vaporization pressure drives the replacement of cryogenic solution by the carrier liquid, for example such that the metal in the ink can be deposited onto the surface inside of the cavity. The thickness of the metal plating can be achieved at atomic scale, for example less than 1 nm. After metal is plated inside of the cavity (e.g., thermal reduction of catalyst precursor, electroless plating, electrolytic plating, etc.), electroless plating or electrolytic plating can be optionally applied to further increase the thickness of the metal coating, for example depositing additional or different metals.

Various objects, features, aspects and advantages of the inventive subject matter will become more apparent from the following detailed description of preferred embodiments, along with the accompanying drawing figures in which like numerals represent like components.

DETAILED DESCRIPTION

Figure 1:
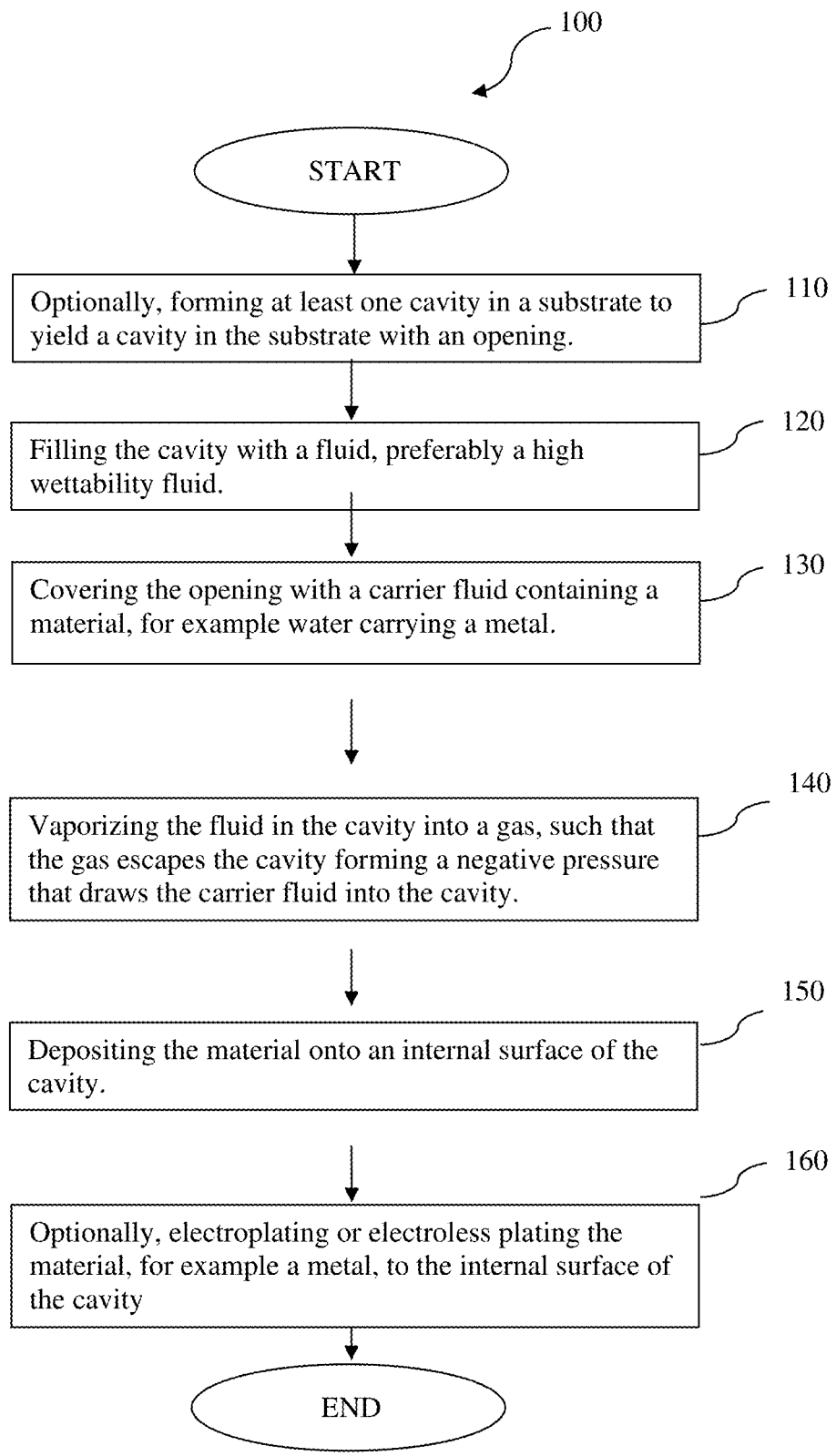
FIG. 1 depicts a flowchart of a method of coating the surface inside of a cavity with a material.

Methods of depositing a material on an interior surface of a cavity in a substrate are contemplated. The cavity is filled at least partially with a first fluid. An opening to the cavity having the first fluid is covered with a second fluid comprising a material source (e.g., metal). Critically, the first fluid has a vapor pressure higher than the second fluid. The first fluid is vaporized into a gas, and the gas is permitted to exit the cavity, thus creating a negative pressure in the cavity. The second fluid is then drawn into the cavity by way of the negative pressure, and the material is deposited from the material source onto the interior surface of the cavity.

In some embodiments the first fluid is a pure fluid, or a combination of fluids, but it is also contemplated that the first fluid further includes a non-fluid substance. In some embodiments, the first and the second fluid are the same. Typically, the cavity has an opening that is very small, for example with a diameter no more than 10 µm, 1 µm, 500 nm, 200 nm, 100 nm, 50 nm, 30 nm, 10 nm, or no more than 5 nm. Likewise, the cavity can be more than 10 mm deep, 20 nm, 50 nm, 100 nm, or more than 200 nm deep.

It is contemplated that the cavity is at least one of a trench, a through hole, a blind via, or a buried via. The substrate typically comprises at least one of a polymer, a metal, a ceramic, a crystal, a glass, a dielectric, or a composite material. Further, while substrates can be provided that already have a cavity, in some methods the cavity is formed in the substrate.

The first fluid is highly wettable, for example a cryogenic liquid (e.g., at least one of argon, helium, hydrogen, nitrogen, oxygen, fluorine, chlorine, neon, argon, krypton, xenon, radon, or derivatives or combinations thereof), but it is also contemplated that the first fluid is an organic solvent. For example, the first fluid can be defined such that it has a contact angle with the substrate of less than 90 degrees. Viewed from another perspective, the first fluid has a surface tension no more than 30 mN/m at standard temperature and pressure (STP). Similarly, the first fluid has a vapor pressure that is higher than water vapor pressure at STP.

The material source generally includes a carboxylate (or plurality of the same or different carboxylates) and a metal (or plurality of the same or different metals). The second fluid generally includes a solvent, for example water or an organic solvent. In some embodiments, the material in the material source is a metal. Preferably, the material is deposited on the interior surface of the cavity to no more than 100 nm thick, for example less than 50 nm, 20 nm, 10 nm, 5 nm, 3 nm, or 1 nm thick. Typically, the material includes at least one of a conductor, a semiconductor, a catalyst, or a combination thereof.

Methods and systems of depositing a material on an interior surface of a cavity in a substrate are further contemplated. The cavity is exposed to a fluid vapor (e.g., heated fluid vapor) and filled at least partially with the fluid vapor. The opening to the cavity is covered with a fluid having a material source. In some embodiments, the fluid vapor is the gaseous form of the fluid. Viewed from another perspective, in some embodiments the fluid vapor is a heated form of the fluid. Preferably the fluid has a lower temperature than the fluid vapor, for example 10%, 20%, 30%, 50%, 100%, 500%, or 1000% lower. In some embodiments, the difference in vapor pressure between the fluid and the fluid vapor is at least 100 mmHg. The fluid vapor is cooled, for example fluid vapor proximal to the (cooler) fluid is cooled by the fluid to reduce a volume of the fluid vapor in the cavity, thus creating a negative pressure in the cavity. The fluid is drawn into the cavity by way of the negative pressure, and the material is deposited from the material source onto the interior surface of the cavity. The material is typically metal, and deposited no more than 100 nm thick.

The principles and operations for such methods and systems, according to the present invention, may be better understood with reference to the accompanying description and drawings.

FIG. 1 depicts a flowchart 100 of a method of coating the surface inside of a cavity with a material.

Figure 2:
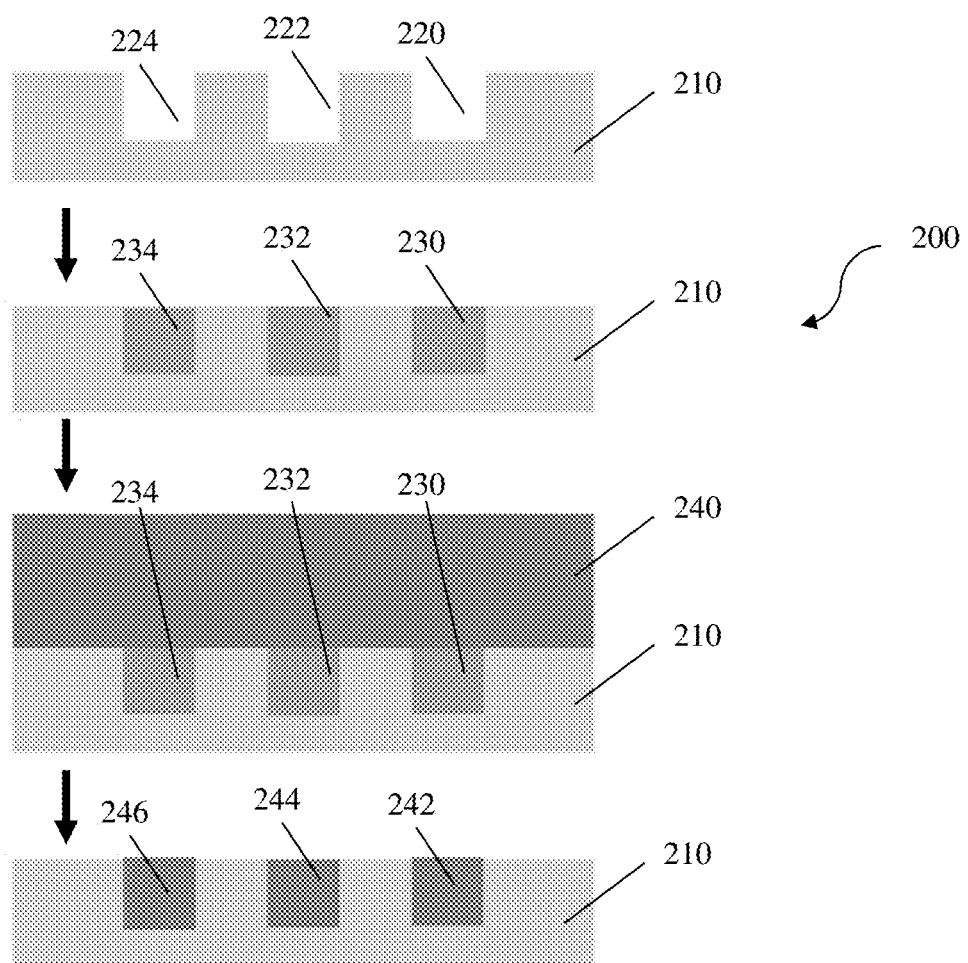
FIG. 2 depicts a schematic diagram for filling nano-scale cavities.

FIG. 2 illustrates a schematic diagram 200 for filling nano-scale cavities 220, 222, and 224 in substrate 210 with carrier fluid 240. In the first step, nano-cavities 220, 222, and 224 are preformed in substrate 210, but it is contemplated that cavities 220, 222, and 224 are formed as a first step in the inventive subject matter. Cavities 220, 222, and 224 can be a through hole, a via, a blind via, a pit, or a trench. As cavities 220, 222, and 224 each have a bottom, it should be appreciated that they are pits, trenches, or a combination thereof.

In the second step, cavities 220, 222, and 224 are filled with a high wettability liquid to form high wettability liquid filled cavities 230, 232, and 234. Its preferred that the high wettability liquid in each cavity is the same, but in some embodiments a different high wettability liquid can reside in each cavity.

In the next step, high wettability liquid filled cavities 230, 232, and 234, and substrate 210, are covered by carrier fluid 240, preferably a water-based ink containing at least one metal conductor or a catalyst. Preferably the vapor pressure of the high wettability liquid is higher (e.g., 30%, 50%, 100%, 300%, 1000% greater) than the vapor pressure in carrier fluid 240.

The high wettability liquid in filled cavities 230, 232, and 234 is then vaporized (e.g., via heat pulse, electrical pulse, photon pulse, magnetic pulse, vibration pulse, acoustic pulse, electromagnetic pulse, or continuous application thereof, etc), with the high wettability liquid escaping from the nano-cavities as a gas. As the gas escapes, a negative pressure is formed in cavities 220, 222, and 224, which draws aliquots of carrier fluid 240 into each cavity, yielding carrier fluid filled cavities 242, 244, and 246. The material (e.g., metal, catalyst, etc) in carrier fluid 242, 244, and 246 is then deposited onto the interior surface of cavities 220, 222, and 224, for example by thermal reduction, electroless plating, electrolytic plating, etc. The steps can be repeated to increase thickness of the layer of deposited material, or followed by electroless or electrolytic plating of conductors as desired.

Figure 3:
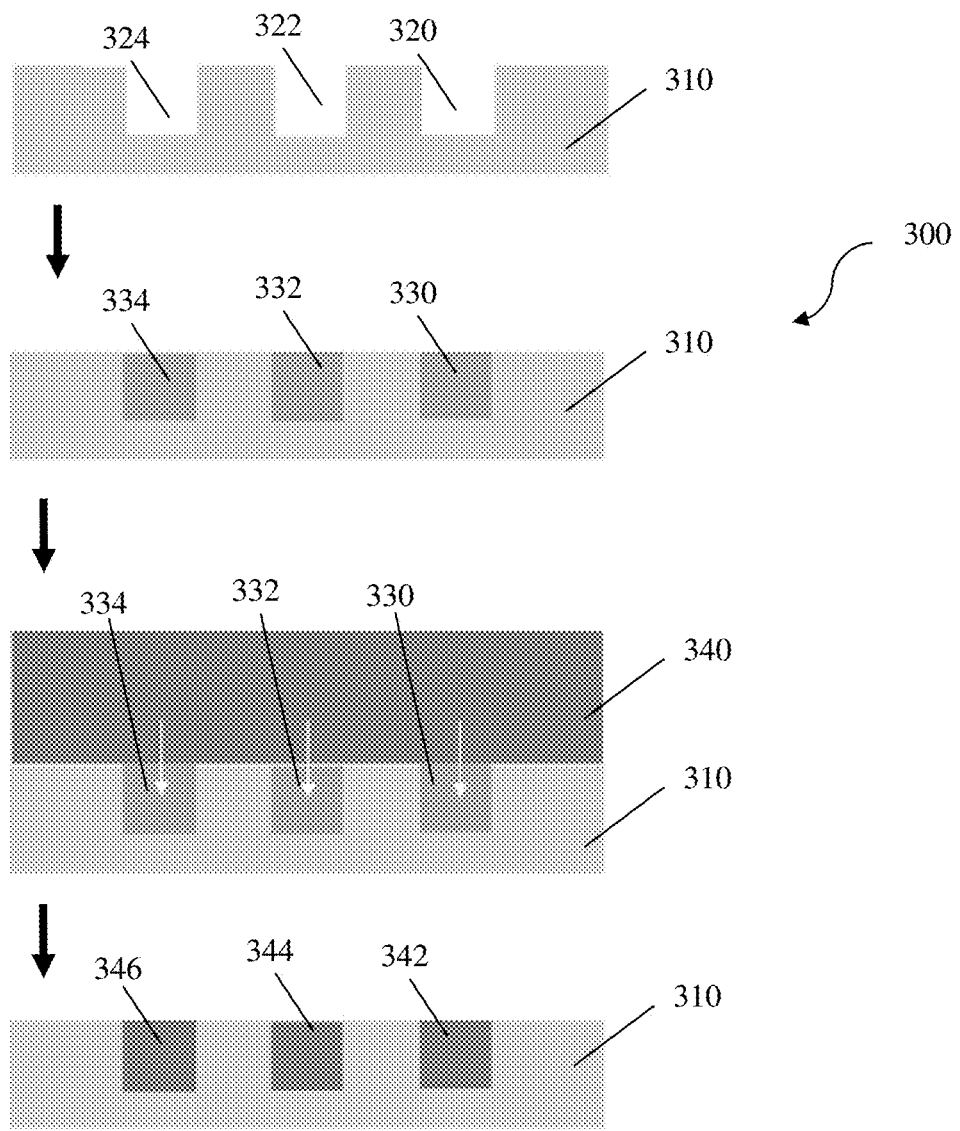
FIG. 3 depicts another schematic diagram for filling nano-scale cavities.

FIG. 3 depicts process 300 of the inventive subject matter, similar to FIG. 2. Substrate 310 has cavities, typically nano-scale, 320, 322, and 324. The first step of forming the cavities is optional, as it is contemplated to receive substrate with preformed cavities. In the second step, vapor fluid 330, 332, and 334 are introduced to substrate 310. Vapor fluid 330, 332, and 334 are typically the same, and are the vapor or gas analog of a fluid generated by heating the fluid near (e.g., within 10%), at (e.g., within 1%), or above (e.g., 120%, 150% 180%, 200%, 300%, 500% or greater) the vapor point of a fluid. Vapor fluids 330, 332, and 334 rest in cavities 320, 322, and 324, and preferably substrate 310 is heated to at or near the temperature of vapor fluid 330, 332, and 334. In some embodiments it is favorable to invert substrate 310, such that vapor fluid 330, 332, and 334 more easily remain in the cavities. In the next step, fluid 340 is introduced, which covers substrate 310 and cavities 320, 322, and 324. Fluid 340 typically has a surface tension that is too high to allow fluid 340 to enter cavities 320, 322, and 324, and is at a lower temperature than vapor fluids 330, 332, and 334 (e.g., 10% lower), preferably much lower (e.g., 20% lower, 30% lower, 50% lower, 80% lower, etc).

In some cases, fluid 340 is the liquid analog of vapor fluids 330, 332, and 334 at a temperature at or below the condensation point of fluid 340. Vapor fluids 330, 332, and 334 are cooled, typically by contact with the lower temperature fluid 340, though cooling of the substrate or extraneous cooling is also contemplated, as an alternative or in combination thereof. As vapor fluids 330, 332, and 334 cool, the volume of the vapor decreases in cavities 320, 322, and 324, for example according to PV=nrT, or appropriate alterations or modification of the ideal gas law. As vapor fluids 330, 332, and 334 attempt to occupy less space as they cool, a pressure is applied against fluid 340, drawing fluid 340 into the cavity. As fluid 340 is drawn further into cavities 320, 322, and 324, vapor fluids 330, 332, and 334 continue to cool. In some embodiments, vapor fluids 330, 332, and 334 ultimately condense into a fluid, preferably the same as fluid 340. The result is fluids 342, 344, and 346 residing in cavities 320, 322, and 324.

Figure 4:
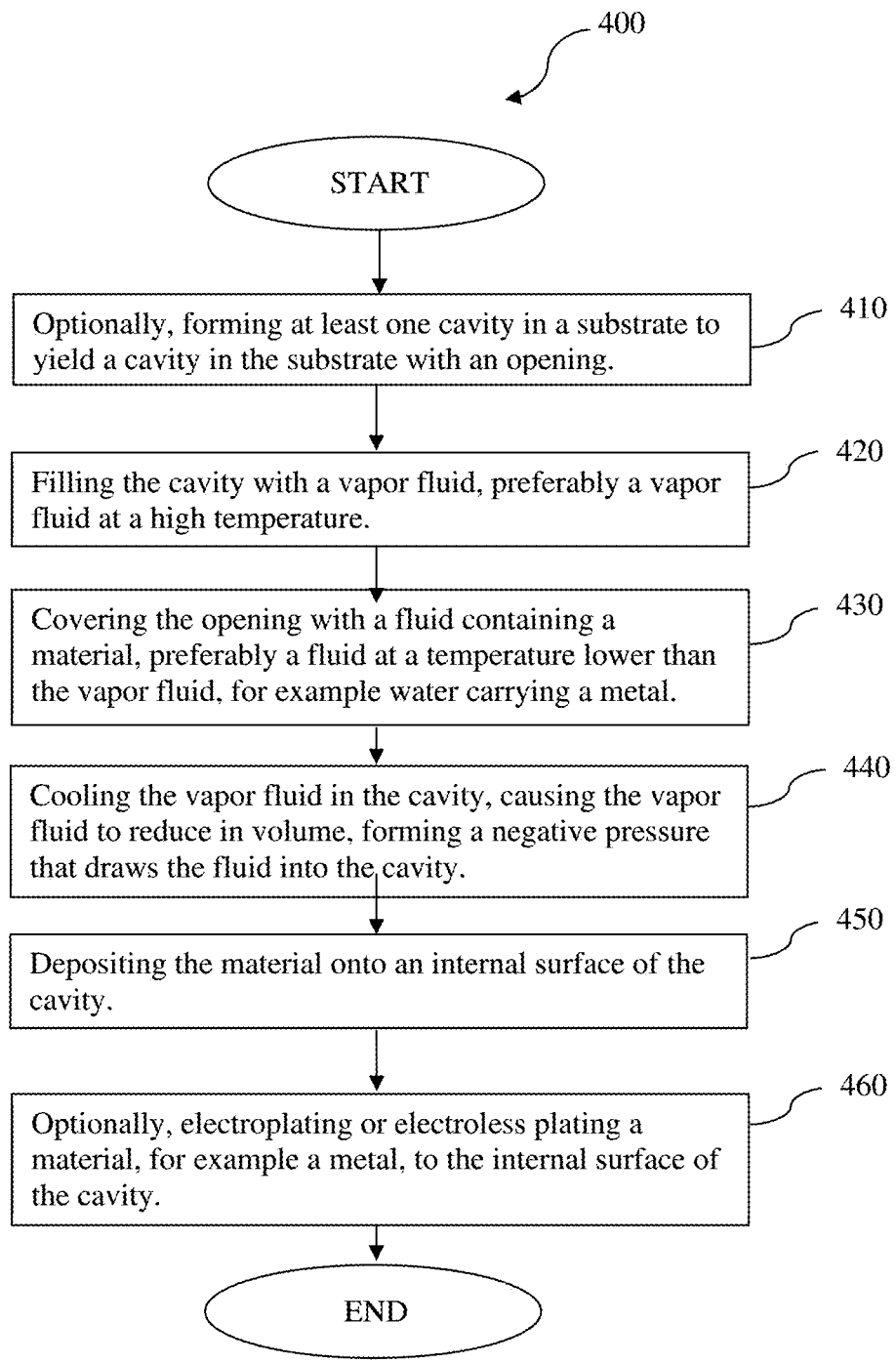
FIG. 4 depicts another flowchart of a method of coating the surface inside of a cavity with a material.

FIG. 4 depicts a flowchart 400 of a method of coating the surface inside of a cavity with a material.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

Unless the context dictates the contrary, all ranges set forth herein should be interpreted as being inclusive of their endpoints, and open-ended ranges should be interpreted to include only commercially practical values. Similarly, all lists of values should be considered as inclusive of intermediate values unless the context indicates the contrary.

The recitation of ranges of values herein is merely intended to serve as a shorthand method of referring individually to each separate value falling within the range. Unless otherwise indicated herein, each individual value with a range is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be apparent to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of depositing a material on an interior surface of a cavity in a substrate, the method comprising:
   exposing the cavity of the substrate to a fluid vapor and filling the cavity at least partially with the fluid vapor;
   covering the cavity with a fluid having a material source, wherein the fluid has a lower temperature than the fluid vapor;
   cooling the fluid vapor proximal to the fluid to reduce a volume of the fluid vapor in the cavity, thus creating a negative pressure in the cavity;

drawing the fluid into the cavity by way of the negative pressure; and depositing the material from the material source onto the interior surface of the cavity.

2. The method of claim 1, wherein the fluid vapor is a pure fluid or a combination of fluids.

3. The method of claim 1, wherein the fluid further comprises a non-fluid substance.

4. The method of claim 1, wherein the cavity has an opening with a diameter no more than 10 μm.

5. The method of claim 1, wherein the cavity is less than 10 mm deep.

6. The method of claim 1, wherein the cavity is at least one of a trench, a through hole, a blind via, or a buried via.

7. The method of claim 1, wherein the substrate comprises at least one of a polymer, a metal, a ceramic, a crystal, a glass, a dielectric, and a composite material.

8. The method of claim 1, further comprising the step of forming the cavity in the substrate.

9. The method of claim 1, wherein the fluid comprises an organic solvent.

10. The method of claim 1, wherein the difference in vapor pressure between the fluid and the fluid vapor is at least 100 mmHg.

11. The method of claim 1, wherein the fluid vapor has high wettability.

12. The method of claim 1, wherein the fluid vapor has a contact angle with the substrate of less than 90 degrees.

13. The method of claim 1, wherein the fluid vapor has a surface tension no more than 30 mN/m at standard temperature and pressure (STP).

14. The method of claim 1, wherein the fluid vapor has a vapor pressure that is higher than water vapor pressure at STP.

15. The method of claim 1, wherein the material source comprises a carboxylate and a metal.

16. The method of claim 1, wherein the material is a metal.

17. The method of claim 1, wherein the material is deposited on the interior surface of the cavity no more than 100 nm thick.

18. The method of claim 1, the material comprises at least one of a conductor, a semiconductor, a catalyst, or a combination thereof.

* * * * *